United States Patent [19]

Stein

[11] 4,259,601

[45] Mar. 31, 1981

[54] COMPARISON CIRCUIT HAVING BIDIRECTIONAL HYSTERESIS

[75] Inventor: Marc T. Stein, Tempe, Ariz.

[73] Assignee: Motorola, Inc., Schaumburg, Ill.

[21] Appl. No.: 967,826

[22] Filed: Dec. 8, 1978

[51] Int. Cl.³ .................. H03K 5/153; H03K 3/295
[52] U.S. Cl. .................................. 307/359; 307/290
[58] Field of Search ............ 307/358, 359, 290, 362; 330/257

[56] References Cited

U.S. PATENT DOCUMENTS

| | | | |
|---|---|---|---|
| 3,628,059 | 12/1971 | Niu | 307/359 X |
| 4,104,547 | 8/1978 | Frederiksen et al. | 307/290 X |

*Primary Examiner*—John Zazworsky

*Attorney, Agent, or Firm*—Michael D. Bingham

[57] ABSTRACT

A monolithic integrated comparator amplifier is provided for comparing an input signal to a nominal reference voltage to produce an output signal only when the input signal is less than the magnitude of the nominal reference voltage. Bidirectional hysteresis is introduced into the amplifier circuit by reducing the magnitude of the nominal reference voltage when the magnitude of the input signal becomes substantially equal to or greater than the nominal reference voltage produced when the amplifier is in a nominal operating state. The magnitude of the reference voltage is controlled by using a feedback switching transistor to vary the resistance of a resistive divider to decrease the reference voltage produced thereby.

13 Claims, 1 Drawing Figure

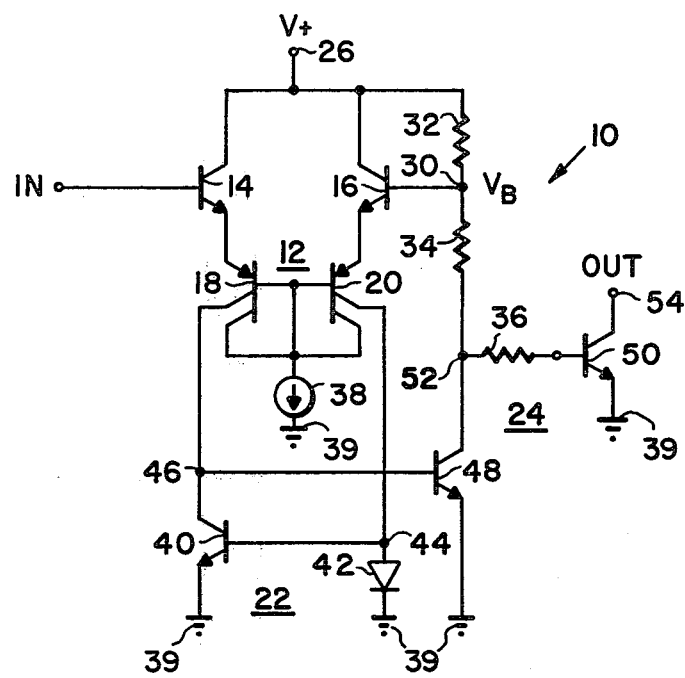

COMPARISON CIRCUIT HAVING BIDIRECTIONAL HYSTERESIS

BACKGROUND OF THE INVENTION

This invention relates generally to a comparison circuit for comparing input signals to a reference potential and more particularly to a comparison circuit having bidirectional hysteresis.

Many forms of comparison circuits are generally known in the art for comparing an input signal to a reference signal to produce an output signal indicative of some predetermined relationship therebetween. Generally, these comparison circuits comprise a differential amplifier circuit wherein a reference potential is applied at one input thereof and an input signal is applied to the other input. A particular kind of load circuitry is connected to the differential amplifier circuit for producing the output signal when the input signal obtains a predetermined relationship with respect to the reference signal. For example, U.S. Pat. No. 3,872,323 to Thomas M. Frederiksen et al, issued Mar. 18, 1975 discloses a comparision circuit comprising such a differential amplifier and a differential to single ended converter circuit which is exemplary of the prior art.

Whenever such comparision circuits are used in a high noise environment there is always a chance that the comparator circuit may be falsely tripped by generated noise. Therefore, it is desirable to introduce hysteresis into the comparator circuit such that after the input signal has reached a predetermined magnitude the comparator circuit will be tripped and thereafter is not affected by any high noise generated on the input signal. Comparison circuits having hysteresis introduced therein are generally known in the art as exemplified by U.S. Pat. No. 3,725,673 issued Apr. 3, 1973 to Thomas M. Frederiksen.

A problem with many of the prior art comparison circuits having hysteresis introduced therein is the complexity of the circuitry required to provide the hysteresis. A need therefore exists in the art to provide a comparision circuit generally free of complexity in its circuitry and therefore inexpensive to fabricate.

SUMMARY OF THE INVENTION

Therefore it is an object of the invention to provide an improved comparison circuit.

It is another object of the present invention to provide a comparison having bidirectional hysteresis introduced therein.

Still another object of the present invention is to provide a comparision circuit, having hysteresis, which is suitable to be manufactured in monolithic integrated circuit form.

In accordance with the foregoing objects a comparison circuit having bidirectional hysteresis is provided in the preferred embodiment of the invention which includes a differential amplifier stage having first and second inputs, a differential-to-single ended circuit coupled to the differential amplifier circuit, and a bias and output circuit coupled to an output of the differential-to-single ended circuit. During quiescent circuit operation the bias and output circuit produces both a nominal bias potential to the second input of the differential amplifier and an output signal from the comparison circuit. At such time when the magnitude of the signal applied at the first input of the differential amplifier becomes greater than the nominal bias potential the bias and output circuit is caused to switch operating states such that the magnitude of the nominal bias potential is significantly reduced whereby hysteresis is introduced into the comparison circuit and the output signal inhibited. This state continues until the signal at the first input of the differential amplifier becomes less than said reduced bias potential and the comparison circuit is returned to its quiescent operating state.

BRIEF DESCRIPTION OF THE DRAWING

The single FIGURE of the drawing is a schematic diagram of a preferred embodiment of the invention.

DETAILED DESCRIPTION OF THE INVENTION

The single FIGURE of the drawing illustrates comparison circuit 10 of the preferred embodiment which is suitable to be manufactured in integrated circuit form. Comparison circuit 10 is shown as including differential amplifier stage 12 comprising NPN transistors 14 and 16 and PNP transistors 18 and 20, differential-to-single ended converter circuit 22, and bias and output circuit 24.

Differential amplifier stage 12 includes NPN transistors 14 and 16 having respective collectors thereof coupled to a source of operating potential, V+, at terminal 26. The base electrode of transistor 14 is adapted to be coupled to an input terminal for receiving an input signal applied thereto. The base electrode of transistor 16 is connected at junction node 30 to a resistive divider network comprising resistors 32, 34 and 36. The emitter electrodes of transistors 14 and 16 are connected, respectively, to the emitter electrodes of multi-collector PNP transistors 18 and 20 of which the base electrodes are interconnected. As shown, a first collector of transistor 18 and transistor 20 are interconnected together with the base electrodes thereof through current source 38 to ground potential 39. The other collector electrode of transistor 18 which forms a first output of differential amplifier 12 and the other collector electrode of transistor 20 which forms the second output of the differential amplifier circuit are connected to differential-to-single ended converter circuit 22 at nodes 46 and 44 respectively.

As is generally known in the art, differential-to-single ended converter circuit 22 comprises a first NPN transistor 40 and diode 42. The collector of transistor 40 is connected to the output of the differential amplifier stage with the emitter electrode thereof being coupled to ground potential 39. The base electrode of transistor 40 is directly connected to the anode of diode 42 and to the second output of the differential amplifier at node 44. The cathode of diode 42 is connected to ground potential 39. An output is provided at node 46 of differential-to-single ended converter 22. As will be explained later in detail, in response to the input signal at the input becoming greater in magnitude than the nominal reference voltage provided at node 30, a driving signal is provided at node 46.

Bias and output circuit 24 includes the resistor divider network comprising resistors 32, 34, and 36, switching transistor 48 and an output transistor 50. Switching transistor 48, an NPN transistor, has its base electrode connected to the output of differential-to-single ended converter circuit 22 at junction 46. The collector of transistor 48 is connected at node 52 to the resistor divider network between resistors 34 and 36. The emitter of switching transistor 48 is coupled to ground reference potential. Transistor 50 has its base electrode connected to resistor 36, its emitter electrode coupled to ground reference potential and its collector electrode coupled to output terminal 54 of the comparison circuit.

Assuming no input signal, comparison circuit 10 is in a nominal state as will be hereinafter described. Normally, transistor 50 is in a saturated state and sinks current at output terminal 54. Further, transistor 48 is in an off state such that a bias reference potential $V_B$ is provided at node 30 produced by the resistive divider network comprising resistors 32, 34 and 36 and the base to emitter junction voltage of transistor 50. In this nominal state, transistor 14 is nonconductive and transistor 16 is conductive. Likewise transistors 18 and 20 are nonconductive and conductive, respectively. Therefore, current is provided at the collector of transistor 20 to differential-to-single ended converter 22 which is connected to the differential outputs of amplifier 12. As is known in the art, differential-to-single ended converter circuit 22 is comprised of a current mirror circuit such that the current flowing through diode 42 is mirrored through transistor 40 to ensure the balanced current conditions mentioned above. Therefore, in a nominal state, current is sourced to diode 42 and transistor 40 is nonconductive. In this condition, no output current is supplied to the base of transistor 48, at node 46. Thus, switching transistor 48 is in an off condition as assumed above.

In response to an input signal applied to the input terminal of comparison circuit 10 becoming substantially equal to or greater than the nominal bias potential, $V_B$, transistor 14 is caused to conduct heavier then transistor 16 which in turn causes a greater magnitude of current at the node 46. This excess current is then utilized to provide base drive current to switching transistor 48 thereby turning this transistor on. Transistor 48 immediately becomes saturated thereby rendering transistor 50 nonconductive. With transistor 48 in a saturated state, the resistive divider network is then comprised of only resistor 32 and 34 plus the saturation voltage of transistor 48. Hence, the bias potential at node 30, $V_B$, is substantially reduced. Transistor 48 will be maintained in a conductive state until such time that the input signal decreases below the magnitude of the reduced bias potential at node 30. When this condition occurs, transistor 48 is then rendered nonconductive because the excess current is no longer available at node 46. $V_B$ then increases to its nominal value. The comparison circuit is then caused to be switched to its nominal operating state, i.e., transistor 50 sinking source current at output terminal 54.

What has been described, is a comparison circuit having bidirectional hysteresis. The hysteresis is introduced into the circuit by providing a first bias potential of a first magnitude which must be overcome by the input signal reaching a value substantially equal to or greater thereto which causes switching at the output of the comparison circuit. In response to the output being switched, the first bias potential is caused to be substantially decreased such that the output cannot be switched back to its original state until such time that the magnitude of the input signal becomes substantially equal to or less than this reduced value. Hence, after the input signal has caused initial switching, any noise generated signal induced on the input signal will not cause the output to be prematurely tripped.

What is claimed is:

1. Comparison circuit having bidirectional hysteresis, comprising in combination:
    a differential amplifier stage having first and second inputs and outputs respectively, said first input being coupled to an input of the comparison circuit for receiving an input signal applied thereto, said second input receiving a controllable bias potential thereat;
    differential-to-single ended circuit means coupled to said first and second outputs of said differential amplifier stage for producing a drive signal at an output thereof whenever the magnitude of said input signal is greater than the magnitude of said controllable bias potential; and
    bias and output circuit means for varying the magnitude of said controllable bias potential from a first level to a second level in response to said input signal becoming greater than said first level, said bias and output circuit including first impedance means coupled between a first node at which is supplied a source potential and a second node and having an output connected to said second input of said differential amplifier stage; circuit means including first electron control means which is normally in a conducting state for supplying a first bias potential at said second node, said circuit means having an output coupled to the output of the comparison circuit; switching circuit means coupled between said output of said differential-to-single ended circuit means and said second node which is responsive to said drive signal for inhibiting said first electron control means of said circuit means and for supplying a second bias potential of different magnitude than said first bias potential at said second node whereby said controllable bias potential is caused to change to said second level value.

2. The comparison circuit of claim 1 wherein said differential amplifier stage includes:
    first and second electron control means each having first, second and control electrodes, said second electrodes of said first and second electron control means being coupled to a source of operating potential, said control electrode of said first electron control means being said first input, said control electrode of said second electron control means being said second input; and
    third and fourth electron control means each having first, second and control electrodes, said control electrodes being interconnected together, said first electrode of said third electron control means being coupled to said first electrode of said first electron control means, said first electrode of said fourth electron control means being coupled to said first electrode of said second electron control means, said second electrodes of said third and fourth electron control means being said first and second outputs respectively.

3. The comparison circuit of claim 2 wherein said differential amplifier stage further includes:
    said first and second electron control means being NPN transistors and said first, second and control electrodes being emitter, collector and base electrodes respectively;
    said third and fourth electron control means being PNP transistors with said first, second and control electrodes being emitter, collector and base electrodes respectively, said third and fourth electron control means each having an additional collector electrode which is coupled to said interconnected base electrodes thereof; and current source means coupled to said interconnected base electrodes of said third and fourth electron control means.

4. The comparison circuit of claim 3 wherein said bias and output circuit means includes:

said first impedance means being a resistor divider circuit having a first and second serially connected resistor with the junction therebetween being said output;

said electron control means of said circuit means having first, second and control electrodes, said first electrode being coupled to a ground reference potential, said second electrode being coupled to the output of the comparison circuit, and second impedance means coupled between said second node and said control electrode of said electron control means; and said switching circuit means being an electron control means having first, second and control electrodes, said first electrode being coupled to said ground reference potential, said second electrode being coupled to said second node and said control electrode being coupled to said output of said differential-to-single ended circuit means.

5. The comparison circuit of claim 4 wherein:

said electron control means of said circuit means being an NPN transistor; and said electron control means of said switching circuit means being a NPN transistor having emitter, collector and base electrodes, said emitter electrode being coupled to said ground reference potential, said collector electrode being connected to said second node, and said base electrode being coupled to the input of the bias and output circuit means.

6. The comparison circuit of claim 2 wherein said differential-to-single ended circuit means includes:

first electron control means having first, second and control electrodes, said first electrode being coupled to said ground reference potential, said second electrode being coupled both to said first output of said differential amplifier stage and to said output of said differential-to-single ended circuit means; and second electron control means having first and second electrodes, said first electrode being coupled to said ground reference potential, said second electrode being coupled both to said control electrode of said first electron control means of said differential-to-single ended circuit means and to said second output of said differential amplifier stage.

7. The comparison circuit of claim 5 wherein said differential-to-single ended circuit means includes:

a first transistor having first and second main electrodes and a control electrode, said first and second main electrodes being serially coupled between said first output of said differential amplifier stage and said ground reference potential, said control electrode being coupled both to said second output of said differential amplifier stage and to said output of said differential-to-single ended circuit means; and diode means coupled between said second output of said differential amplifier stage and said ground reference potential.

8. The comparison circuit of claim 6 wherein:

said first electron control means being an NPN transistor with said first, second and control electrodes being emitter, collector and base electrodes; and said second electron control means being a diode.

9. A monolithic integrated comparison circuit having bidirectional hysteresis, comprising in combination:

a differential amplifier stage having first and second inputs and outputs respectively, said first input being coupled to an input of the comparison circuit for receiving an input signal applied thereto, said second input receiving a controllable bias potential thereat;

differential-to-single ended circuit means coupled to aaid first and second outputs of said differential amplifier stage for producing a drive signal at an output thereof whenever the magnitude of said input signal is greater than the magnitude of said controllable bias potential level; and bias and output circuit means for providing a first bias potential level at said second input of said differential amplifier stage when the comparison circuit is in a nominal operating state and for providing a second bias potential level thereat whenever the magnitude of said input signal exceeds said first bias potential, said second bias potential level being lower than said first bias potential level, said bias and output circuit means including a first transistor having first and second main electrodes and a control electrode, said control electrode being coupled to said output of said differential-to-single ended circuit means, said first main electrode being coupled to a terminal at which is supplied a ground reference potential, said second main electrode being coupled to a first circuit node, said first transistor being rendered conductive by said drive signal; first impedance circuit means coupled between a source of operating potential and said first circuit node and having an output coupled to said second input of said differential amplifier stage; a second transistor having first, second and control electrodes, said first and second electrodes being coupled between said terminal receiving a ground reference potential and an output of the comparison circuit; and second impedance circuit means coupled between said first circuit node and said control electrode of said second transistor.

10. The comparison circuit of claim 9 wherein said differential amplifier stage includes:

first and second transistors each having first, second and control electrodes, said second electrodes of said first and second electron control means being coupled to said source of operating potential, said control electrode of said first transistor being said first input, said control electrode of said second transistor being said second input; and third and fourth transistors each having first, second and control electrodes, said control electrodes being interconnected together, said first electrode of said third transistor being coupled to said first electrode of said first transistor, said first electrode of said fourth transistor being coupled to said first electrode of said transistor, said second electrodes of said third and fourth transistors being said first and second outputs respectively.

11. The comparison circuit of claim 10 wherein said differential amplifier stage further includes:

said first and second transistors being NPN bipolar transistors and said first, second and control electrodes being emitter, collector and base electrodes respectively;

said third and fourth transistors being PNP bipolar transistors with said first, second and control electrodes being emitter, collector and base electrodes respectively, said third and fourth transistors each having an additional collector electrode which is coupled to said interconnected base electrodes thereof;

current source means coupled to said interconnected base electrodes of said third and fourth transistors and reference circuit means coupled between said source of operating potential and a ground reference potential for providing a first reference potential at said base electrode of said first transistor.

12. The comparison circuit of claim 11 wherein:

said first transistor of said bias and output circuit means being an NPN transistor; and said second transistor of said bias and output circuit means being a NPN transistor.

13. The comparison circuit of claim 10 wherein said differential-to-single ended circuit means includes:

a transistor having first, second and control electrodes, said first electrode being coupled to said ground reference potential, said second electrode being coupled both to said first output of said differential amplifier stage and to said output of said differential-to-single ended circuit means; and a diode means having first and second electrodes, said first electrode being coupled to said ground reference potential, said second electrode being coupled both to said control electrode of said transistor of said differential-to-single ended circuit means and to said second output of said differential amplifier stage.

* * * * *